United States Patent [19]

Ward

[11] Patent Number: 4,916,519
[45] Date of Patent: Apr. 10, 1990

[54] SEMICONDUCTOR PACKAGE

[75] Inventor: William C. Ward, Burlington, Vt.

[73] Assignee: International Business Machines Corporation, Armonk, N.Y.

[21] Appl. No.: 358,992

[22] Filed: May 30, 1989

[51] Int. Cl.$^4$ ............................................. H01L 23/48
[52] U.S. Cl. ...................................... 357/70; 357/68; 357/71; 357/72; 357/80; 357/81; 357/84
[58] Field of Search ............................... 357/72, 68, 70

[56] References Cited

U.S. PATENT DOCUMENTS

| | | | |
|---|---|---|---|
| 3,842,492 | 10/1974 | Kamerbeek et al. | 29/588 |
| 4,264,917 | 4/1981 | Ugon | 357/74 |
| 4,417,392 | 11/1983 | Ibrahim et al. | 29/840 |
| 4,532,538 | 7/1985 | Wurz | 357/70 |
| 4,771,330 | 9/1988 | Long | 357/80 |
| 4,800,419 | 1/1989 | Long et al. | 357/72 |
| 4,801,997 | 1/1989 | Ono et al. | 357/72 |
| 4,812,896 | 3/1989 | Rothgery et al. | 357/72 |
| 4,818,895 | 4/1989 | Kaufman | 357/70 |
| 4,821,148 | 4/1989 | Kobayashi et al. | 357/72 |
| 4,843,036 | 6/1989 | Schmidt et al. | 357/72 |

OTHER PUBLICATIONS

Supplement to Electronic News, 8-15-75.
Co-pending application, Ser. No. 161,319, filed Feb. 19, 1988.

Primary Examiner—Andrew J. James
Assistant Examiner—James W. Pemrick
Attorney, Agent, or Firm—Francis J. Thornton

[57] ABSTRACT

In an encapsulated semiconductor module in which a semiconductor chip, having a major surface with terminals thereon, is deposed within the encapsulating material, a plurality of self-supporting, unitary, discrete, and continuous lead frame conductors formed of metal sheet stock are positioned at various locations around the chip and cantilevered out of the encapsulating material, so that discrete wires can be used to connect respective ones of said conductors to respective ones of said terminals. In the present invention excessively long bonding wires are avoided by connecting a selected one of said lead frame conductors to a parallel conductor by a jumper wire and connecting the parallel conductor to the desired terminal with a short wire.

8 Claims, 3 Drawing Sheets

SEMICONDUCTOR PACKAGE

BACKGROUND OF THE INVENTION

1. Field of the Invention

This invention relates to packaged wire bonded semiconductor chips. More particularly, it relates to a wire bonded chip in which none of the wires used to make electrical contact between the lead frame and the chip terminals cross one another, thus eliminating a possible defect mechanism.

2. Description of the Prior Art

Wire bonding techniques have long been employed to position and affix leads to semiconductor chips prior to encapsulation of the chip in a protective coating.

Such techniques generally employ a lead frame to which the semiconductor chip is attached prior to encapsulation. Gold wires are used to connect terminals on the surface of the semiconductor chip to corresponding lead frame conductors.

In general, the initial design is such that these wires are kept within specified lengths. Good practice dictates that the length of the wires should be minimized and not exceed 100 times the diameter of the wire. However, when new chip designs are created in order, for example, to stack the chips in a denser package or to replace prior existing chips, the new designs often require one or more new terminal locations while the outside circuit or machine requirements demand that the external lead frame conductors remain in the same position. In such a case, extremely long wires which can cross several such other wires might be considered. If such long wires are used, as these long wires pass from the conductors of the lead frame to the respective terminal on the chip surface, undesirable effects can occur especially during the subsequent encapsulation step. For example, during the encapsulation steps there exists a strong likelihood that any such long wire will deform and short to one or more of the wires it is crossing. The possibility of such shorting, during the encapsulation process, increases with both the length of the crossing wire and the number of wires over which it crosses.

SUMMARY OF THE INVENTION

It is the object of this invention to provide a packaged semiconductor chip with improved mechanical, and electrical performance.

Another object of the invention is to provide a semiconductor chip package in which lead frame conductors can be easily and safely connected to a number of different chip terminals, thereby permitting the use of the same external lead frame configuration with different semiconductor chips.

It is yet another object of the present invention to provide a semiconductor package with enhanced reliability.

These and other objects of the present invention are provided in an encapsulated semiconductor module in which a semiconductor chip, having a major surface with terminals thereon, is deposed within the encapsulating material, a plurality of self-supporting, unitary, discrete, and continuous lead frame conductors formed of metal sheet stock are positioned at various locations around the chip and cantilevered out of the encapsulating material, so that discrete wires can be used to connect respective ones of said conductors to respective ones of said terminals. In the present invention excessively long bonding wires are avoided by connecting a selected one of said lead frame conductors to a parallel conductor by a jumper wire and connecting the parallel conductor to the desired terminal with a short wire.

These and other objects, features, and advantages of the invention will be apparent from the following more particular description of the preferred embodiment of the invention as illustrated in the accompanying drawings.

DESCRIPTION OF THE PREFERRED EMBODIMENT

Figure 1:
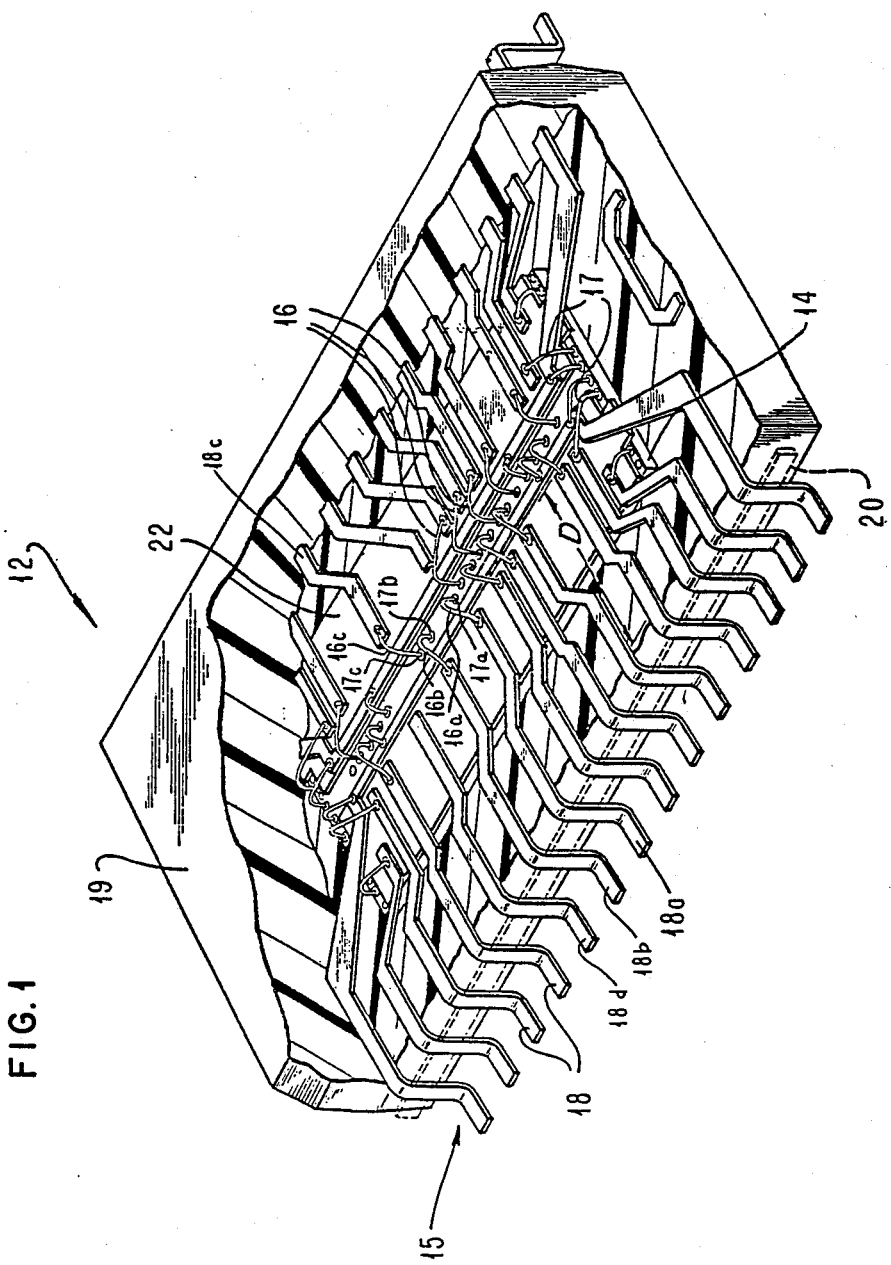
FIG. 1, is a schematic representation of a wire bonded encapsulated semiconductor chip. Part of the encapsulation material has been broken away to expose the lead frame conductors, the semiconductor chip, the chip terminals, and the wires used to connect the conductors to the chip terminals.

A semiconductor package 12 containing a semiconductor chip 14 in which part of the encapsulation is removed is shown in FIG. 1. The chip 14 supports a multi-conductor lead frame 15 whose leads or conductors 18 are electrically connected to respective terminals 17 on the surface of the semiconductor chip 14 by bonding wires 16.

During encapsulation in material 19, the conductors 18 are supported as a unit by the lead frame bar 20 shown in phantom in FIG. 1. After the encapsulation material is hardened, this lead frame bar 20 is removed.

The term "lead frame", as used herein, has a definite meaning in the semiconductor art. The material, thickness, strength, etc. of such lead frames has long been specified and known to the art, such that the use of the term "lead frame" is all that is necessary to purchase such items. In essence, the term "lead frame", means a metal structure, preferably a spot plated copper alloy, formed from sheet stock and a sufficient size and strength to meet specific mechanical strength requirements. For example, such a lead frame is discussed in the *Semiconductor International*, April, 1985. In the present invention the lead frame is typically between 0.005 and 0.015 inches thick and comprised of a number of fingers or conductors between 0.008 and 0.017 inches wide. These conductors are thus of a sufficient mechanical strength to be successfully handled and inserted into sockets or assembled and soldered to printed circuit boards.

As shown in FIG. 1, the interior portions of the lead frame conductors 18 extend over the semiconductor chip 14 but are separated from the semiconductor chip surface by an interposer 22 that can also serve both as an insulator and/or as an alpha particle barrier.

When it is desired that this interposer 22 be also an alpha particle barrier, then it should be comprised of a polymeric film having thermal stability at temperatures of 175 degrees C. and not contain an ionizable species such as halides and active metals, including sodium, potassium, and phosphorus. Polyimide films are suitable for such use as alpha barriers. One such polyimide film is sold under the trade name Kapton. Desirably, such Kapton films should be between 1.0 and 2.0 mils in thickness and may be thermally enhanced by alumina or silicon nitride.

The interposer layer 22 can also be solely an adhesive layer, so long as it is electrically insulating. In use, such an adhesive layer is applied to the lead frame conductors or the top active surface of chip 14; i.e., the major upper surface of the chip which contains the chip terminals 17. To absolutely assure there is no possibility of short circuit to the chip, in spite of the fact that the chips are coated with this passivating insulating adhesive, it is preferable to further use a dielectric interposer positioned between the lead frame conductors and the chip. When such an interposer is used, the adhesive layer should be applied to both surfaces of the interposer with suitable adhesive materials. Adhesives which are suitable for use for attaching the lead frame conductors to the semiconductor chip or to such a dielectric interposer can be selected from the group of epoxies, acrylics, and polyimides containing phenolics, such as polyimide-butyral:phenolic.

Once the lead frame 15 has been suitably secured to the surface of the chip, wires 16 are bonded to the tips of selected lead frame conductors 18 and bonded to selected chip terminals 17. Each wire extends from the tip of a selected lead frame conductor to a selected chip terminal. Once the desired wire bonds are in place, as shown in FIG. 1, the device is encapsulated in a suitable plastic material using well known packaging techniques. Following encapsulation of the assembly, the lead frame bar 20, which supports the leads and which is required during encapsulation, is removed. This lead frame bar is originally provided to connect the conductors 18, of the lead frame 15, so as to impart rigidity to the lead frame 15 and to limit flow of the encapsulating material. Because the lead frame bar 20 has been removed, it is shown in the figure in phantom.

Following this removal of the lead frame bar 20, those portions of the lead frame conductors 18, which extend beyond the encapsulation 19, may be formed as required.

As previously noted, respective terminals 17 are connected to respective conductors 18 by wires 16. The configuration of the lead frame conductors 18 is preferably such that the length of the wires 17 is maintained at a length of less than about 80 mils. Minimizing the length of these wires 17 not only improves the electrical performance of the packaged semiconductor chip, but further imparts a greater rigidity to the wires reducing the possibility of breakage or shorting of the wires to other elements in the package.

Since, it is preferable to maintain these wires at the shortest possible length, the initial semiconductor chip design and lead frame design is usually done so as to assure such wires are as short as possible and within the 80 mil length. In the structure shown in FIG. 1, the wires 16 are maintained in this short configuration by arranging the bulk of the terminal pads 17 in a central row. This arrangement not only reduces the impedance of the chip itself by reducing conducting channel lengths within the chip, but also reduces time delays, signal noise, and etc.

When the chip design shown in FIG. 1, for some reason or other, cannot be compactly designed or must be redesigned, for example to make the chip meet different requirements or to assure different speeds or to correct errors made in the design, it is sometimes necessary to relocate a particular chip terminal pad. Thus, for example, as shown in FIG. 1, lead frame conductor 18a is bonded via wire 16a to a nearby terminal 17a. For purposes of illustration only, it will be assumed that the terminal 17a will have to be eliminated and functionally relocated because of a chip redesign.

Figure 2:
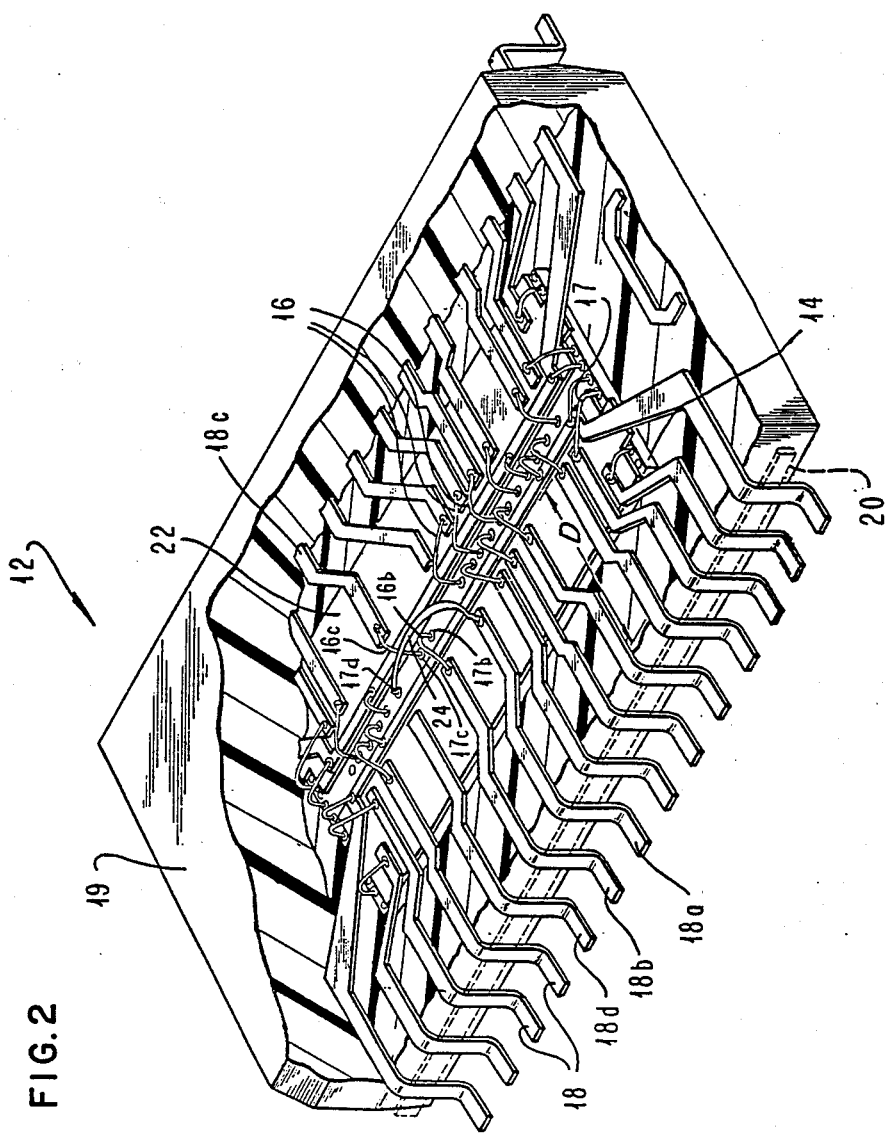
FIG. 2, shows the chip in FIG. 1 with one long wire that has been rerouted because of design changes in the terminal locations on the chip surface.

FIG. 2 shows for example, the prior art method of accommodating this design change. In FIG. 2 there is shown the same structure as shown in FIG. 1 except that the terminal 17a has been eliminated and the conductor 18a is now connected to a distant, newly created terminal 17d via an excessively long wire 24, which crosses the wire 16b, connected between conductor 18b and pad 17b, and wire 16c connected between conductor 18c and pad 17c. Because the wire 24 is quite long and crosses over, or is immediately adjacent to, these two additional wires; namely, wires 16a and 16b, any distortion of this wire 24, during encapsulation, can cause the wire 24 to bend or deform such that it can contact and short out either or both of the crossed wires 16a or 16b, thus causing a failure in the packaged chip. It is desirable that this is avoided.

Figure 3:
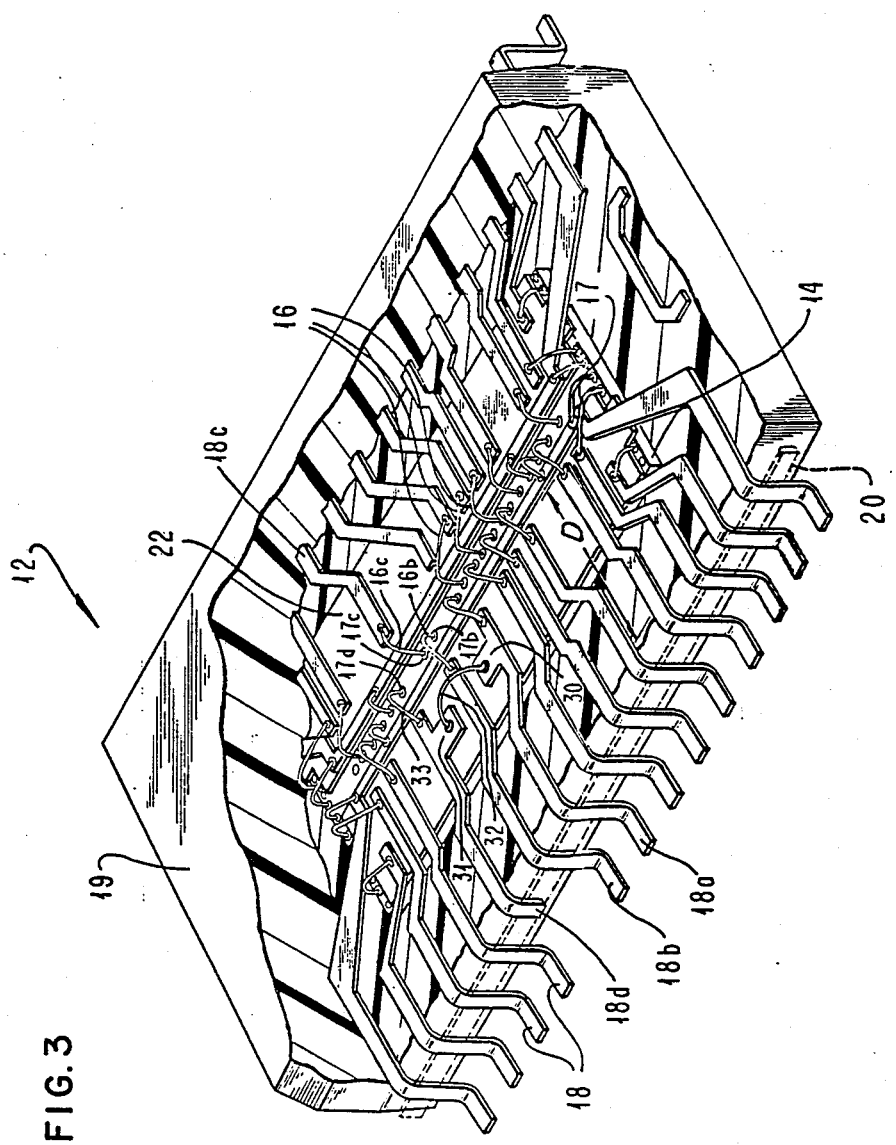
FIG. 3, shows the redesigned chip of FIG. 2 in which one embodiment of the present invention is used to avoid the hazards of the long wire shown in FIG. 2.

FIG. 3 shows the present invention in which this long wire 24 has been completely eliminated and with its elimination, the defect mechanisms described above. In this FIG. 3, parallel conductors 18a and 18d are each provided with a respective T-like extension or jutty, 30 and 31. These jutties 30 and 31 extend toward one another and toward an intermediate conductor 18b. A distinctive short jumper wire 32 spans conductor 18b and connects the two jutties 30 and 31 while a separate and distinct short wire 33 connects lead 18d to the newly created chip terminal 17d. To assure that conductor 18d does not contact any exterior unit and that only lead 18a will supply information via wires 32 and 33 to the newly created terminal 17d, the end of conductor 18d can be excised during removal of the cross member 20 after encapsulation.

Thus these extended jutties and unused leads, together with the short wires 32 and 33, replace the long undesirable wire 24 shown in FIG. 2. This design now provides a method as to how the length of relocated wires can now be controlled. The present invention therefore teaches that the lead frame conductors can be redesigned in such a way that wire bonds can be significantly reduced in length and the bridging of an excessive number of other conductors can be eliminated.

It should be obvious that each such extended jutty need only be of a size to accommodate the bonding of a wire thereto and need not extend any significant distance toward any other jutty. Also, such jutties can be placed at any convenient place on the lead frame conductor.

While the normal features of this invention have been described in terms of a preferred embodiment, in particular applications it will be appreciated that various omissions, and substitutions may be made by those skilled in the art without departing from the spirit of the invention.

What is claimed is:

1. An encapsulated module comprising:
   a semiconductor chip having a major surface with terminals thereon disposed within an encapsulating material, and
   a plurality of discrete and continuous lead frame conductors at spaced locations around said chip and cantilevered out of the encapsulating material, said lead frame conductors including at least two non-adjacent conductors separated by a third, intervening lead frame conductor, and discrete wires bonded to and connecting selected ones of said lead frame conductors to selected ones of said terminals, characterized by at least one of said non-adjacent lead conductors being connected to the other of said non-adjacent lead frame conductors by a discrete wire bonded to and connecting said at least one of said non-adjacent lead frame conductors and said other one of said non-adjacent lead frame conductors and passing over said third, intervening lead frame conductor without connection thereto.

2. The module of claim 1, wherein said discrete wires, bonded between the lead frame conductors and the chip terminals, are formed of gold.

3. The module of claim 2 where said lead frame conductors are insulatively disposed upon said major surface.

4. The module of claim 1 wherein at least two of said lead frame conductors are provided with areas disposed to support wire bonding between said lead frame members.

5. The module of claim 4 wherein said areas are spaced from the ends of said lead frame conductors.

6. The module of claim 1, wherein said discrete wires, bonded between the lead frame conductors and the chip terminals, are formed of copper.

7. An encapsulated module comprising:

a semiconductor chip having a major surface with terminals thereon disposed within an encapsulating material, and a plurality of discrete and continuous lead frame conductors at spaced locations insulatively disposed on said major surface of said chip and cantilevered out of the encapsulating material, and discrete wires bonded to and connecting selected ones of said lead frame conductors to selected ones of said terminals, the improvement comprising at least one of said lead frame conductors being connected to another non-adjacent one of said lead frame conductors by a discrete wire bonded to and connecting said one conductor and said other conductor and passing over a third lead frame conductor without connection thereto.

8. The module of claim 7 wherein at least two of said lead frame members, non-adjacent to one another, are provided with areas disposed to support wire bonding between said lead frame members.

* * * * *